United States Patent
Matsumoto

(10) Patent No.: US 11,531,287 B2
(45) Date of Patent: Dec. 20, 2022

(54) OPTICAL SCANNING DEVICE, IMAGE FORMING APPARATUS, AND METHOD FOR SELECTING COMPONENT

(71) Applicant: SHARP KABUSHIKI KAISHA, Sakai (JP)

(72) Inventor: Kazutaka Matsumoto, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 17/039,753

(22) Filed: Sep. 30, 2020

(65) Prior Publication Data
US 2021/0103229 A1 Apr. 8, 2021

(30) Foreign Application Priority Data
Oct. 8, 2019 (JP) .............................. JP2019-185302

(51) Int. Cl.
*G03G 15/043* (2006.01)
*G03G 15/04* (2006.01)
*H01S 5/068* (2006.01)

(52) U.S. Cl.
CPC ..... *G03G 15/043* (2013.01); *G03G 15/04072* (2013.01); *H01S 5/06804* (2013.01)

(58) Field of Classification Search
CPC ...................... G03G 15/04072; H01S 5/06804
See application file for complete search history.

(56) References Cited

U.S. PATENT DOCUMENTS

| 4,375,067 A * | 2/1983 | Kitamura | H01S 5/02326 372/50.21 |
| 2010/0181507 A1* | 7/2010 | Maruyama | H05B 45/18 250/552 |
| 2014/0138372 A1* | 5/2014 | Ogura | G03G 15/2042 399/329 |

FOREIGN PATENT DOCUMENTS

| JP | 2003-298178 A | 10/2003 |
| JP | 2017-102207 A | 6/2017 |

OTHER PUBLICATIONS

JP_2017102207_A_T Machine Translation, Japan, Jun. 2017, Kono.*

* cited by examiner

*Primary Examiner* — Victor Verbitsky
(74) *Attorney, Agent, or Firm* — ScienBiziP, P.C.

(57) ABSTRACT

An optical scanning device includes: a light source; a light source driver that provides the light source with a drive current, on which a bias current that fluctuates according to temperature change is superimposed, for emitting light from the light source; and a bias current adjuster that provides the light source driver with a bias control signal for adjusting a magnitude of the bias current, wherein the bias current adjuster includes a current value adjusting member that is capable of changing the magnitude of the bias control signal according to temperature change, and wherein the bias control signal that has automatically changed according to temperature change of the current value adjusting member is provided to the light source driver, so that the light source driver makes the magnitude of the bias current to be superimposed fluctuate, based on the provided bias control signal.

5 Claims, 12 Drawing Sheets

RELATIONSHIP BETWEEN OSCILLATION DELAY TIME AND TEMPERATURE

CHANGE IN OSCILLATION DELAY TIME BECAUSE OF PRESENCE/ABSENCE OF THERMISTOR

| | OSCILLATION DELAY TIME td (nsec) | | | |
|---|---|---|---|---|
| | td1 | td2 | td CHANGE AMOUNT (td2−td1) | |
| TEMPERATURE | 25°C | 60°C | | |
| WITHOUT-THERMISTOR | 11.1 | 15.2 | 4.1 | DELAY AMOUNT: LARGE |
| WITH-THERMISTOR | 11.1 | 10.9 | −0.2 | DELAY AMOUNT: SMALL |

FIG. 6B

CALCULATION FORMULA
OF OSCILLATION DELAY TIME td $$td = \tau s \, \log_e \frac{Iop - Ib}{Iop - Ith}$$

td : OSCILLATION DELAY TIME
$\tau$ s : CARRIER LIFE
Ib : BIAS CURRENT
Ith : THRESHOLD CURRENT
Iop : DRIVE CURRENT

FIG. 7A

| ADJUSTMENT ONLY BY FIXED RESISTOR (Ib=7mA) (WITHOUT-THERMISTOR) | |
|---|---|
| (A-1) CASE OF NO TEMPERATURE CHANGE (25° C) | |
| Ith_Ave | 13.4 [mA] |
| Iop_Ave @15mW | 38.4 [mA] |
| P_Ave @110(dec) | 5.0 [mW] |
| Iop_Ave | 21.8 [mA] |
| τs | 19.5 |
| Ib_Ave | 7.0 [mA] |
| td_Ave | 11.1 [ns] |
| (A-2) CASE OF TEMPERATURE CHANGE (25° C TO 60° C) | |
| Ith_Ave | 13.4 [mA] |
| Ith_Ave_up | 17.8 [mA] |
| Iop_Ave @15mW | 38.4 [mA] |
| P_Ave @110(dec) | 5.0 [mW] |
| Iop_Ave | 21.8 [mA] |
| Iop_Ave_up | 27.0 [mA] |
| τs | 19.5 |
| Ib_Ave | 7.0 [mA] |
| td_Ave_up | 15.2 [ns] |
| td DIFFERENCE DUE TO TEMPERATURE CHANGE (15.2−11.1=4.1) | 4.1 [ns] |

FIG. 7B

| ADJUSTMENT BY FIXED RESISTOR AND THERMISTOR (Ib=7mA) (WITH-THERMISTOR) | |
|---|---|
| (B-1) CASE OF NO TEMPERATURE CHANGE (25° C) | |
| Ith_Ave | 13.4 [mA] |
| Iop_Ave @15mW | 38.4 [mA] |
| P_Ave @110(dec) | 5.0 [mW] |
| Iop_Ave | 21.8 [mA] |
| τ s | 19.5 |
| Ib_Ave | 7.0 [mA] |
| td_Ave | 11.1 [ns] |
| (B-2) CASE OF TEMPERATURE CHANGE (25° C TO 60° C) | |
| Ith_Ave | 13.4 [mA] |
| Ith_Ave_up | 17.8 [mA] |
| Iop_Ave @15mW | 38.4 [mA] |
| P_Ave @110(dec) | 5.0 [mW] |
| Iop_Ave | 21.8 [mA] |
| Iop_Ave_up | 27.0 [mA] |
| τ s | 19.5 |
| Ib_Ave | 10.95 [mA] |
| td_Ave_up | 10.9 [ns] |
| td DIFFERENCE DUE TO TEMPERATURE CHANGE (10.9−11.1=−0.2) | −0.2 [ns] |

OPTICAL SCANNING DEVICE, IMAGE FORMING APPARATUS, AND METHOD FOR SELECTING COMPONENT

BACKGROUND OF THE INVENTION

Field of the Invention

The present invention relates to an optical scanning device and an image forming apparatus including the optical scanning device, and, particularly, the present invention relates to an optical scanning device that performs scanning with light emitted from a light source in order to form an electrostatic latent image corresponding to image data on a photosensitive drum, and to an image forming apparatus including the optical scanning device.

Description of the Background Art

Image forming apparatuses have been conventionally used, but, in recent years, multifunction peripherals with many functions such as a document reading (scanning) function, facsimile function, and network connecting function, in addition to a document printing function and a copying function, have been in use.

In such a multifunction peripheral, in order to form an electrostatic latent image on a photosensitive drum, an optical scanning device that performs scanning to irradiate the photosensitive drum with light emitted from a light source, such as a laser diode, is utilized.

Furthermore, nowadays, since there is a demand of making printing functions or the like become even faster, it is required that the responsiveness of a laser diode included in an optical scanning device is made faster. That is, it is required to shorten the time for stabilizing the light emission intensity of emitted laser light after a drive current is provided to a laser diode. For example, in order to make the responsiveness of a laser diode faster, an optical scanning device including a bias application circuit of a fixed bias type, which supplies a bias current of a fixed value to the laser diode, is used.

However, the responsiveness of a laser diode fluctuates with changes in the temperature of the laser diode. For example, in a case where the temperature of the laser diode is low, the threshold current at which light emission starts is relatively small and the responsiveness is preferable, but, as the temperature of the laser diode rises, the threshold current increases and the responsiveness deteriorates. Therefore, it is required that the responsiveness remains preferable and does not fluctuate even though the temperature of the laser diode rises.

In order to satisfy the above-described demands, for example, in Japanese Unexamined Patent Application Publication No. 2003-298178, there is described a light emitting element driving device of what is termed as an automatic bias control type, in which light output of a laser diode is received by a photodiode and, by comparing the voltage corresponding to the light output with a predetermined reference voltage, the bias current to be applied to the laser diode is automatically controlled, so that the bias current adjusted according to temperature change is supplied to the laser diode.

Furthermore, in Japanese Unexamined Patent Application Publication No. 2017-102207, there is described an optical scanning device including: a temperature detector that detects the temperature of a light source; a light source driver that supplies a drive current, on which a bias current is superimposed, to the light source; a bias current controller that controls the magnitude of the bias current by use of a predetermined control table according to the detected temperature; and a bias current setting resistor that is connected to the light source driver to set an integrated resistance value that can be changed by combining multiple switching elements and fixed resistors, wherein the bias current controller changes the setting of the integrated resistance value according to the detected temperature, so as to control the magnitude of the bias current to be supplied to the light source in a step-by-step manner.

However, in a case of such a light emitting element driving device of an automatic bias control type as in Japanese Unexamined Patent Application Publication No. 2003-298178, the circuit for controlling the bias current according to temperature change is complicated, which makes the device expensive.

Further, in a case of an optical scanning device of Japanese Unexamined Patent Application Publication No. 2017-102207, it is necessary to include a temperature detector, a bias current setting resistor configured with multiple switching elements and fixed resistors, complicated wiring for setting multiple integrated resistance values, a control table that indicates the correspondence relationship between temperatures and the switching elements, etc., so that the configuration of a circuit becomes complicated and the size of the circuit becomes large, and therefore the device is not necessarily low priced. Furthermore, because of the configuration in which the magnitude of the bias current is controlled in a step-by-step manner, in order to set the magnitude of the bias current more minutely, it is necessary to prepare many switching elements and fixed resistors and a control table in which a complicated correspondence relationship is set in advance, which makes the device expensive.

On the other hand, for an optical scanning device and image forming apparatus nowadays, both reducing the price and preventing the responsiveness of a laser diode from fluctuating as much as possible even with temperature change are required. That is, with at least not a significant cost increase, such a device of which the responsiveness of the laser diode does not fluctuate even with temperature change is demanded.

Therefore, the present invention has been made in consideration of such situations as described above, and an object of the present invention is to provide an optical scanning device with a circuit configuration as low priced as possible which changes the bias current to be supplied to the light source according to temperature change of the light source in order to maintain preferable responsiveness of the light source, so that the responsiveness of the light source barely changes even with temperature change, and to provide an image forming apparatus including the optical scanning device.

SUMMARY OF THE INVENTION

The present invention is to provide an optical scanning device including: a light source; a light source driver that provides the light source with a drive current, on which a bias current that fluctuates according to temperature change is superimposed, for emitting light from the light source; and a bias current adjuster that provides the light source driver with a bias control signal for adjusting a magnitude of the bias current, wherein the bias current adjuster includes a current value adjusting member that is capable of changing the magnitude of the bias control signal according to temperature change, and wherein the bias control signal that has automatically changed according to temperature change of the current value adjusting member is provided to the light source driver, so that the light source driver makes the magnitude of the bias current to be superimposed fluctuate, based on the provided bias control signal.

Furthermore, it is characterized in that the current value adjusting member is a thermistor. Moreover, it is characterized in that the bias current adjuster includes one thermistor and one fixed resistor that are connected in series. Additionally, it is characterized in that the bias current adjuster includes multiple thermistors and one fixed resistor.

Furthermore, it is characterized in that the thermistor is placed in the vicinity of the light source or the light source driver.

Moreover, it is characterized in that, in order to increase the bias current so that the bias current becomes closer to a predetermined threshold current as the temperature of the light source rises, a thermistor with such a characteristic that a resistance value thereof decreases by a predetermined resistance change amount according to the temperature rise is selected as the thermistor.

Additionally, it is characterized in that a change amount $\Delta R$ of the total resistance value of the bias current adjuster, which corresponds to a current change amount of the bias current that increases while the temperature of the light source changes from the first temperature T1 to the second temperature T2 (>T1), is calculated, and that such a thermistor whose resistance value changes by the change amount $\Delta R$ while the temperature of the thermistor changes from the first temperature to the second temperature is selected.

Furthermore, the present invention is to provide an image forming apparatus including any of the above-described optical scanning devices.

Moreover, the present invention is to provide a method for selecting a component of a bias current adjuster of an optical scanning device which includes a light source, a light source driver that provides the light source with a drive current, on which a bias current that fluctuates according to temperature change is superimposed, for emitting light from the light source, and a bias current adjuster that provides the light source driver with a bias control signal for adjusting a magnitude of the bias current, wherein the bias current adjuster includes one thermistor and one fixed resistor that are connected in series, the method including: setting a lower limit temperature T1 and an upper limit temperature T2 for emitting light from the light source; setting a total resistance value R01 of the bias current adjuster and a setting value Ib1 of the bias current at the lower limit temperature T1; setting a total resistance value R02 of the bias current adjuster and a setting value Ib2 of the bias current at the upper limit temperature T2; calculating a resistance change amount $\Delta R$ of total resistance value of the bias current adjuster from R01−R02; selecting, as a thermistor of the bias current adjuster, a thermistor whose resistance value changes by the resistance change amount $\Delta R$ according to the temperature change from the lower limit temperature T1 to the upper limit temperature T2; storing a first resistance value Rs1 at the lower limit temperature T1 and a second resistance value Rs2 at the upper limit temperature T2 of the selected thermistor; calculating a resistance value Rb1 of a fixed resistor at the lower limit temperature T1 from R01−Rs1; and selecting, as a fixed resistor of the bias current adjuster, a fixed resistor whose resistance value at the lower limit temperature T1 is the calculated resistance value Rb1.

According to the present invention, it is possible to provide an optical scanning device in which a bias current adjuster includes a current value adjusting member that is capable of changing the magnitude of a bias control signal according to temperature change, and the bias control signal that has automatically changed according to temperature change of the current value adjusting member is provided to a light source driver, so that the light source driver makes the magnitude of the bias current to be superimposed fluctuate, based on the provided bias control signal, and therefore, without a significant cost increase of the price of the optical scanning device, preferable responsiveness of the light source can be maintained even with temperature change of the light source.

BRIEF DESCRIPTION OF THE DRAWINGS

FIG. 6A and FIG. 6B are explanatory diagrams of an embodiment of the relationship between light output and current and an embodiment of the calculation formula of the oscillation delay time;

FIG. 7A and FIG. 7B are explanatory diagrams comparing measured values of the bias current and calculated values of the oscillation delay time corresponding to temperature changes in a case where a thermistor is not included and in a case where a thermistor is included;

DESCRIPTION OF THE PREFERRED EMBODIMENTS

Hereinafter, embodiments of the present invention will be explained with reference to the drawings. Note that the present invention is not limited to the description of the embodiments below. Here, an embodiment of an optical scanning device included in an image forming apparatus will be explained. In a case where the optical scanning device is included in the image forming apparatus, the optical scanning device functions as an exposure device that irradiates a charged photosensitive drum with light in order to form an electrostatic latent image corresponding to the image data to be generated on the photosensitive drum. However, the optical scanning device of the present invention can be applied not only to an image forming apparatus but also to an apparatus that needs to perform scanning with light in a predetermined direction, such as a laser processing apparatus or a projector.

First, an explanation is given of an outline of the image forming apparatus including the optical scanning device, and then the embodiments of the optical scanning device will be explained.

Configuration of Image Forming Apparatus

Figure 1:
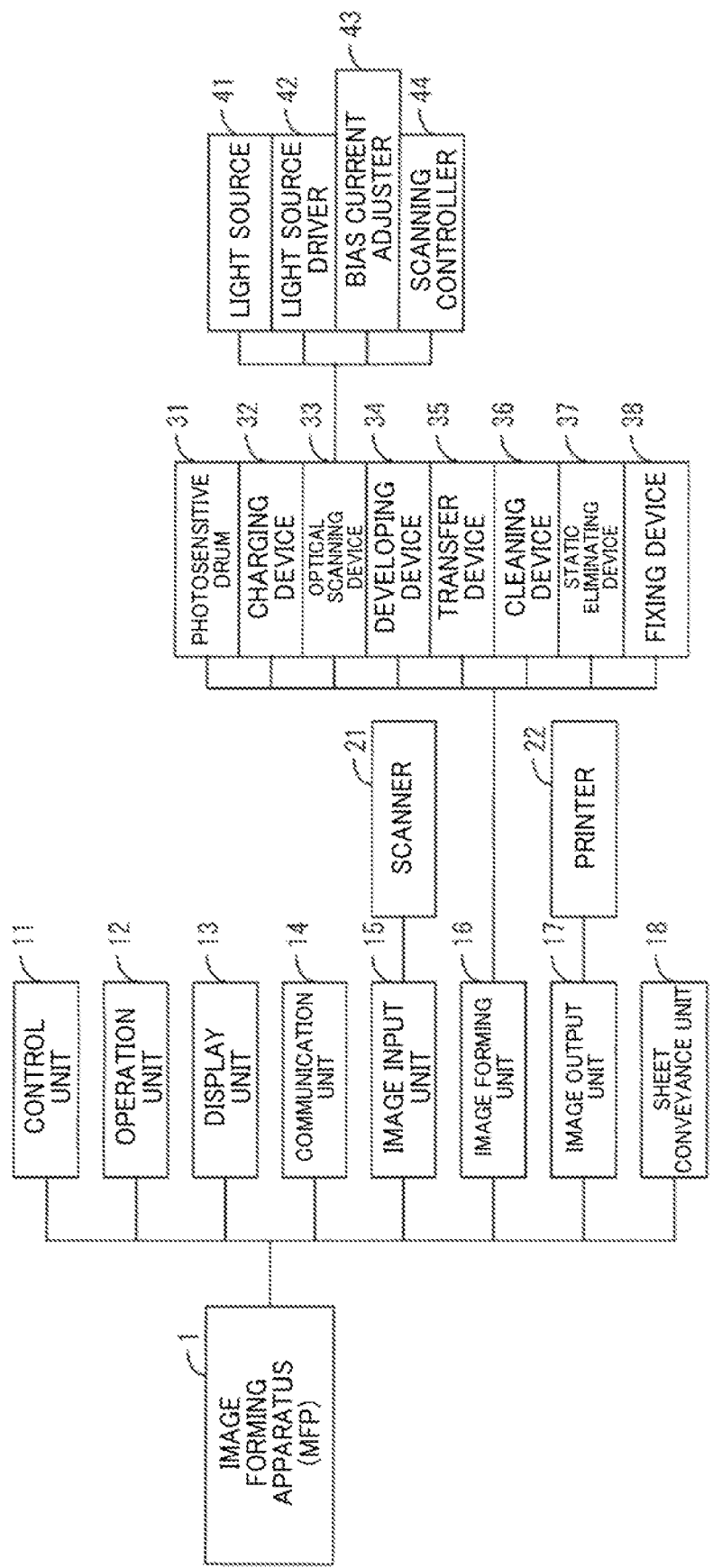
FIG. 1 is a schematic configuration block diagram of an embodiment of an image forming apparatus of the present invention.

In FIG. 1, a schematic configuration block diagram of an embodiment of the image forming apparatus of the present invention is illustrated. The image forming apparatus (hereinafter also referred to as an MFP: Multifunction Peripheral) 1 is an apparatus that processes image data, such as an electronic apparatus having a copying function, a printing function, a document reading function (scanning function), a document editing function, a FAX function, a communication function, etc.

In FIG. 1, the image forming apparatus (MFP) 1 of the present invention mainly includes a control unit 11, an operation unit 12, a display unit 13, a communication unit 14, an image input unit 15, an image forming unit 16, an image output unit 17, and a sheet conveyance unit 18.

The control unit 11 is a part that controls the operation of each component such as the operation unit and the image forming unit, and the control unit 11 is realized mainly by a microcomputer including a CPU, ROM, RAM, I/O controller, timer, and the like. The CPU organically operates various kinds of hardware, based on a control program stored in advance in the ROM, etc., so as to execute the image forming function of the present invention.

The operation unit 12 is an input device for users of the image forming apparatus to perform predetermined input operations. For example, the operation unit 12 is a part that inputs information such as characters and selects a function as an input, and, as the operation unit 12, a keyboard, a mouse, a touchscreen, etc., are used. Moreover, for example, a user who is going to execute copying or the like can use the operation unit 12 to input a setting item such as the number of copies to be made or, alternatively, can check a message displayed on the display unit and utilize the touchscreen or the like for performing a predetermined input operation, so as to select a setting item that is necessary for the copying as an input.

The display unit 13 is a part that displays information, and the display unit 13 displays information necessary for executing each function, a result of execution of a function, etc., in order to inform the user thereof. For example, in a case where an LCD, organic EL display, or the like is used and a touchscreen is used as the operation unit 12, the display unit and the touchscreen are placed so as to overlap with each other. For example, an inquiry message for the user, a setting item and information necessary for executing a printing function, a document reading function, etc., of the image forming apparatus, or the like are displayed on the display unit 13 by use of characters, symbols, images, icons, etc.

The communication unit 14 is a part that performs communication with a server or another information processing apparatus via a network. For example, image data is received from a server connected to the network. Alternatively, image data generated by an image forming apparatus is sent to a server. As the network, a LAN, WAN such as the Internet, other dedicated lines, or the like are utilized, and the communication method thereof can be either wired communication or wireless communication.

The image input unit 15, the image forming unit 16, and the image output unit 17 correspond to an image processing unit that executes the original functions of the image forming apparatus, and the image processing unit is a part that executes an image forming function, by which predetermined information is input so that image information is formed and output based on the input information. The image input unit 15 is a part that inputs predetermined image information, the image forming unit 16 is a part that converts input image data into information that can be printed, etc., or forms print information, and the image output unit 17 is a part that outputs the formed print information or the like to a print sheet, etc.

The image input unit 15 is for inputting information such as a document on which an image, a character, a figure, or the like is described, and, as the image input unit 15, a scanner (reading device) 21 for reading a document on which information is printed is used, for example. Furthermore, the image forming apparatus includes a platen on which a document to be read is placed, so that a document is placed inside a predetermined reading region of the platen. Other than reading of a document, there are various methods for inputting image information.

For example, an interface for connecting an external storage device such as a USB memory or hard disk may correspond to the image input unit 15. It is also possible that electronic data files, such as a print image to be input, are saved in an external storage device such as a USB memory, and, by connecting the USB memory or the like to an input interface such as a USB terminal and performing a predetermined input operation with the operation unit 12, a desired electronic data file that is saved in the USB memory or the like is read out and stored as electronic data.

In addition, it is also possible to receive a print image, etc., through data communication via a network such as the Internet by connecting to a server or an information processing apparatus such as a personal computer in which the print image is stored in advance. Moreover, it is also possible to use a camera with a communication function to capture an image of a sheet on which a print image is rendered, so that, by connecting to the camera via wireless communication, the captured print image is received.

Generally speaking, for example, in a case where image data is printed on a recording sheet, the image forming unit 16 continuously performs each of the steps including charging, exposing, developing, transferring, cleaning, static eliminating, and fixing, so as to form the image data on the recording sheet. The image forming unit 16 is configured mainly with a photosensitive drum 31, a charging device 32, an optical scanning device 33 corresponding to the exposure device, a developing device 34, a transfer device 35, a cleaning device 36, a static eliminating device 37, a fixing device 38, etc.

The photosensitive drum 31 is a member on which an electrostatic latent image of the image data to be generated is formed. The charging device 32 is a device that charges the surface of the photosensitive drum to a predetermined potential. The optical scanning device 33, which corresponds to the exposure device, is a device that scans the surface of the charged photosensitive drum with light, so as to form an electrostatic latent image of the image data to be generated, on the surface of the photosensitive drum. The developing device 34 is a device for developing an electrostatic latent image, that is, the developing device 34 is a device that develops an electrostatic latent image formed on the surface of the charged photosensitive drum, by means of toner supplied from a toner cartridge, so as to form a toner image corresponding to the electrostatic latent image on the photosensitive drum.

The transfer device 35 is a device that transfers the toner image formed on the surface of the photosensitive drum onto a print sheet. The cleaning device 36 is a device that removes excess toner remaining on the surface of the photosensitive drum, and the static eliminating device 37 is a device that removes the static electricity of a charged section such as the surface of the photosensitive drum, so that the charged section returns to the normal potential. The fixing device 38 is a device that heats and pressurizes the print sheet on which the toner image is formed, in order to fix the toner image on the print sheet, onto the print sheet.

Although an explanation is given of the configuration of the optical scanning device 33 with reference to FIG. 2 and FIG. 3 that are described later, the optical scanning device 33 is configured mainly with a light source 41, a light source driver 42, a bias current adjuster 43, and a scanning controller 44. The light source 41 is a part that emits light, the light source driver 42 is a part that controls the intensity, the emission time, etc., of the light emitted from the light source 41, and the scanning controller 44 is a part that changes the direction of the light emitted to the surface of the photosensitive drum.

The bias current adjuster 43 is a part that provides the light source driver 42 with a control signal for applying a bias current to the light source 41. Further, as will be described later, in the present invention, the bias current adjuster 43 is configured with a thermistor and a fixed resistor, so that, by use of the fact that the resistance value of a thermistor depends on temperature, the light source 41 is provided with a bias current that is properly adjusted by changing the control signal according to temperature change in the vicinity of the light source.

The image output unit 17 is a part that outputs the formed image data. For example, a printer 22 is used as the image output unit 17, and a print image formed on a predetermined print sheet (paper medium) is output by use of the image output unit 17. Note that outputting of image data is not limited to printing, but may also be storing of image data in an external storage device such as a USB memory or sending of image data to another information processing apparatus or a server via a network such as the Internet.

The sheet conveyance unit 18 is a part that takes a print sheet out from a sheet feeding cartridge, in which print sheets are accommodated, and conveys the print sheet to an image forming section having the photosensitive drum, the developing device, etc., then conveys the print sheet, on which the image data is formed, toward a sheet discharging tray. The sheet conveyance unit 18 is configured with multiple conveyance rollers.

Configuration of Optical Scanning Device

Figure 2:
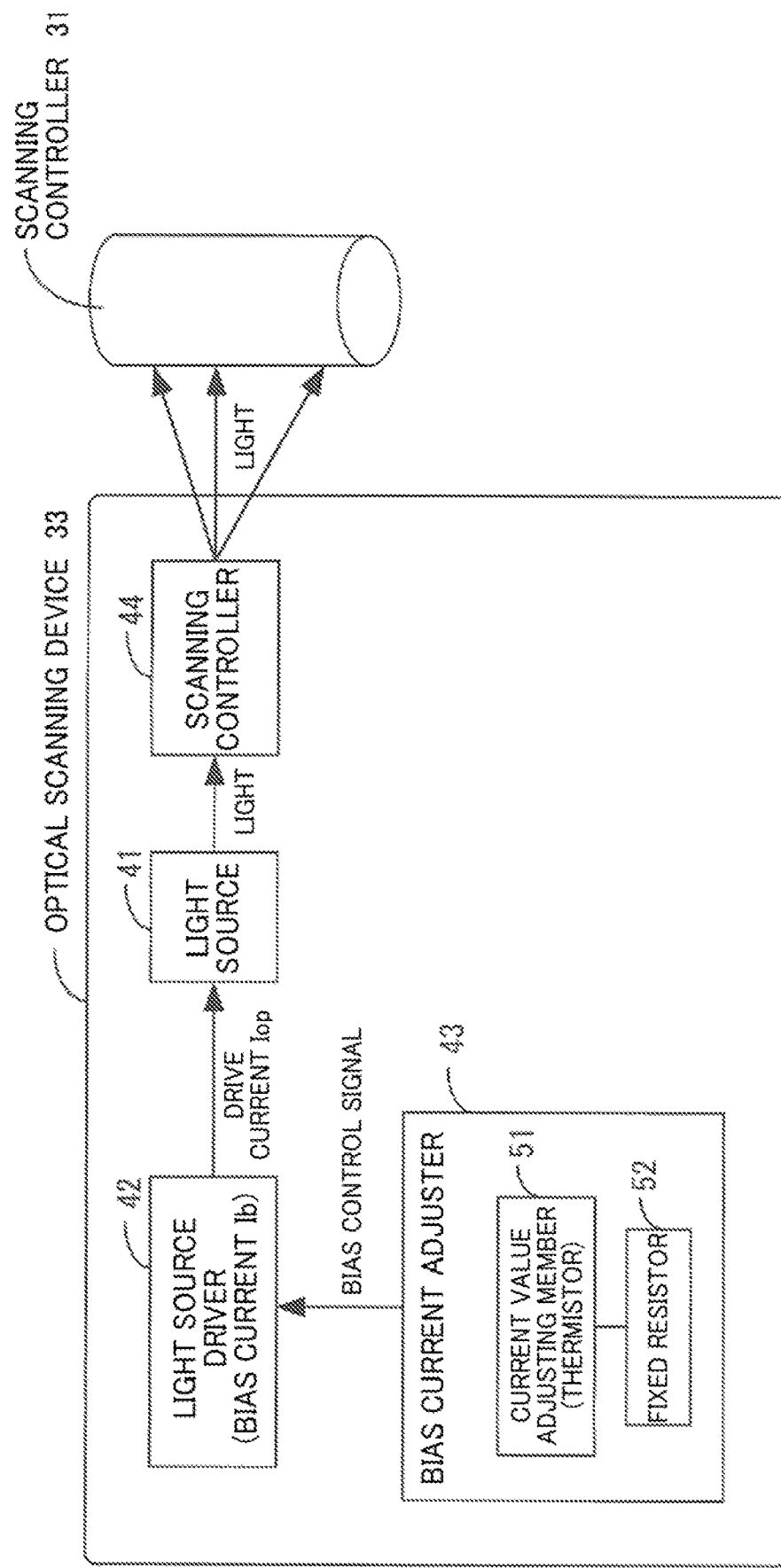
FIG. 2 is a configuration block diagram of an embodiment of an optical scanning device of the present invention.

In FIG. 2, a configuration block diagram of an embodiment of the optical scanning device of the present invention is illustrated. In FIG. 3, a block diagram of an embodiment of a configuration related to driving of the light source of the optical scanning device of the present invention is illustrated. As described above, the optical scanning device 33 is included in the image forming unit 16 of the image forming apparatus and is configured mainly with the light source 41, the light source driver 42, the bias current adjuster 43, and the scanning controller 44. As the light source 41, for example, a laser diode is used, so that light (hereinafter also referred to as laser light) corresponding to the magnitude of a drive current Iop, which is provided from the light source driver 42, is emitted. The scanning controller 44 is configured with optical components such as multiple reflection mirrors, a rotary multifaceted mirror (polygon mirror) that reflects and guides light toward the photosensitive drum so as to perform scanning, and multiple lens, so that the scanning controller 44 drives the polygon mirror, based on scanning control signals provided from the control unit 11, in order to perform scanning with light.

The light source driver 42 corresponds to a laser driver, and the light source driver 42 provides the light source 41 with a drive current Iop corresponding to the image data to be formed, based on a light emission control signal that is sent from the control unit 11. The drive current Iop is a current for emitting light from the light source 41, and a bias current is superimposed on the drive current Iop in order to improve the responsiveness of the light source. Here, the light source driver 42 is connected to the bias current adjuster 43, so as to provide the light source 41 with the drive current Iop on which a bias current Ib, whose current value fluctuates according to temperature changes because of adjustment by a control signal from the bias current adjuster 43, is superimposed. Here, the bias current Ib has a constant current value if the temperature in the vicinity of the light source is constant.

The bias current adjuster 43 is a part that provides, to the light source driver 42, a control signal (which is referred to as a bias control signal or a bias control value) for adjusting the magnitude of the bias current Ib. The bias current adjuster 43 is configured with a current value adjusting member 51 and a fixed resistor 52. The current value adjusting member 51 is a member that is capable of changing the magnitude of the bias control signal according to temperature changes, and it is possible to use, as the current value adjusting member 51, an electronic component whose resistance value changes according to temperature changes.

The bias control signal that has automatically changed according to temperature changes of the current value adjusting member 51, which is included in the bias current adjuster 43, is provided to the light source driver 42, and the light source driver 42 fluctuates the magnitude of the bias current Ib to be superimposed on the drive current Iop, based on the provided bias control signal.

The current value adjusting member 51 may be any electronic component whose resistance value changes according to temperature changes, but it is particularly preferable if the current value adjusting member 51 is an electronic component whose resistance value decreases as the temperature rises. Therefore, for example, a thermistor is used as the current value adjusting member 51 in view of its small size and low price.

Figure 3:
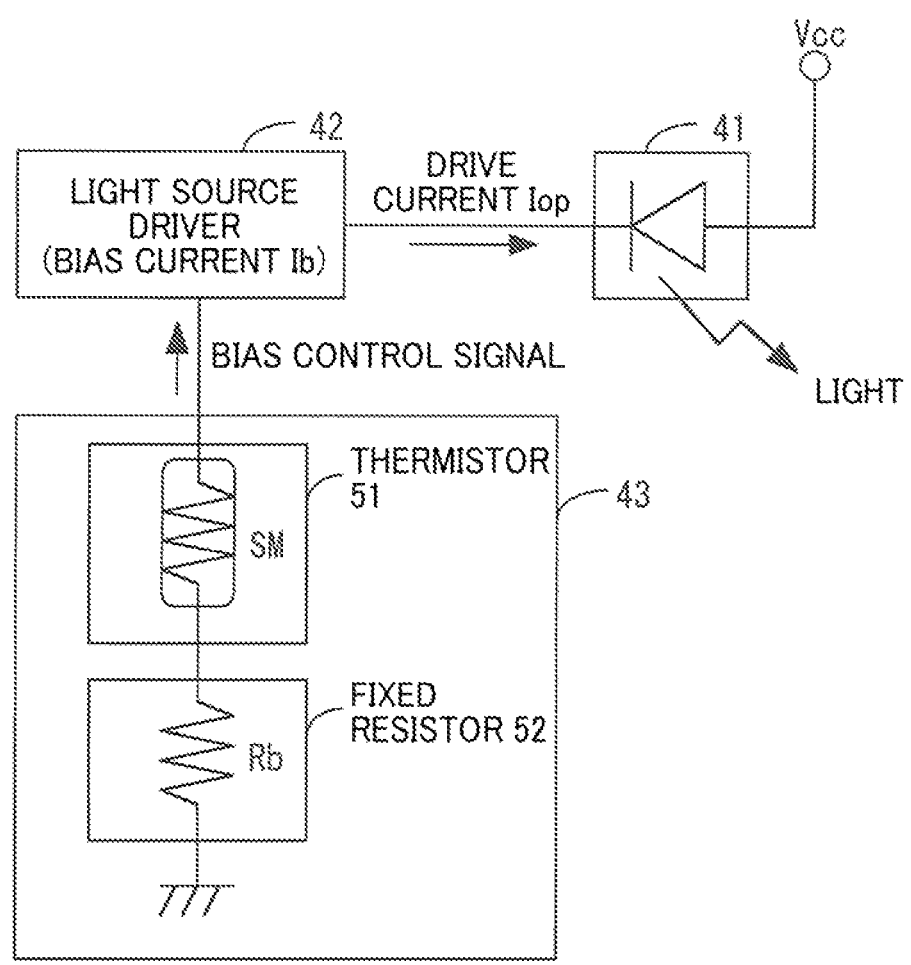
FIG. 3 is a block diagram of an embodiment of a configuration related to driving of a light source of the optical scanning device of the present invention.

Additionally, as illustrated in FIG. 3, the bias current adjuster 43 is configured with at least one thermistor SM 51 and one fixed resistor Rb 52. In this case, for example, the thermistor SM 51 and the fixed resistor Rb 52 are connected in series. Furthermore, one end of the fixed resistor Rb 52 is grounded, the other end of the fixed resistor Rb 52 is connected to one end of the thermistor SM 51, and the other end of the thermistor SM 51 is connected to a terminal for bias current adjustment, which is provided in the bias current adjuster 43. The bias control signal is input to the terminal for bias current adjustment.

Figure 10:
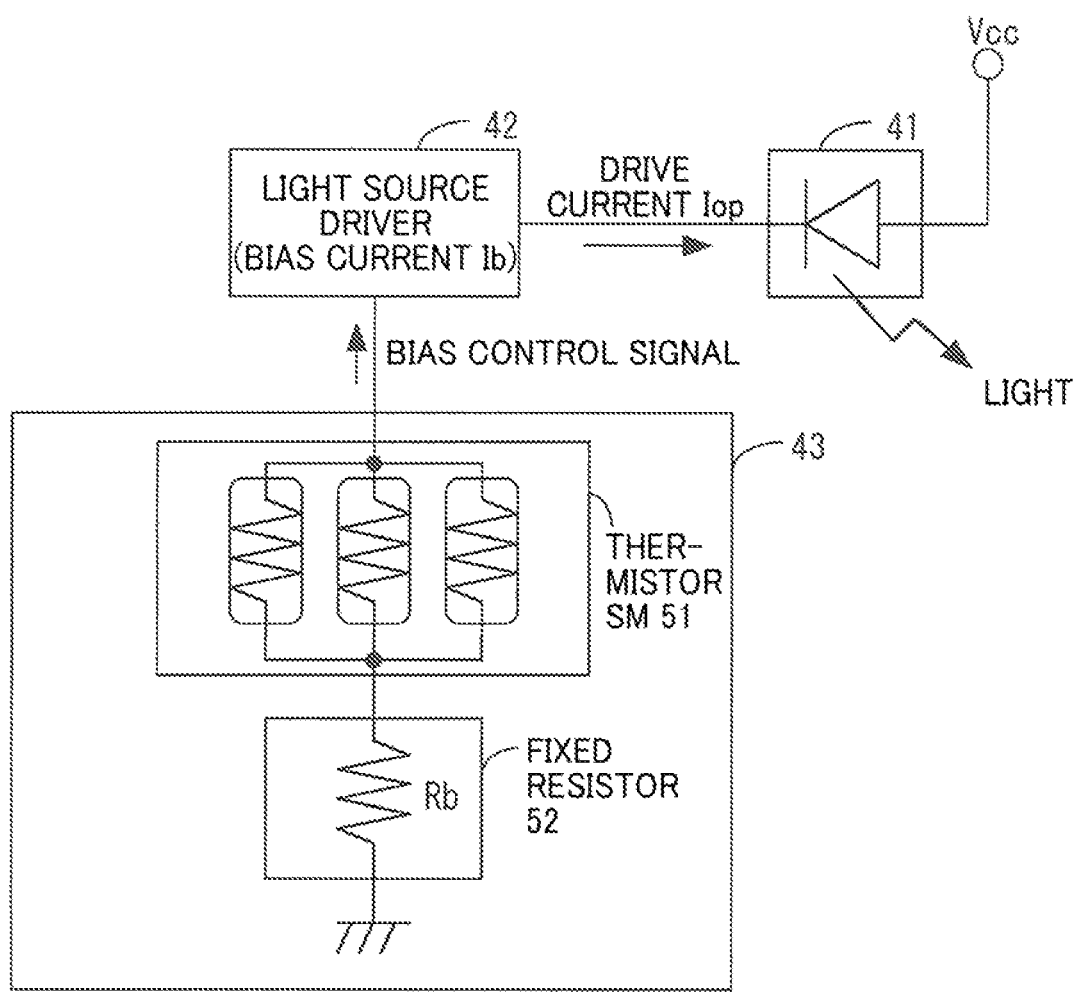
FIG. 10 is a block diagram of an embodiment of a configuration related to driving of a light source of the optical scanning device of the present invention.

Note that the number of thermistors SM 51 is not limited to one, and, as illustrated in FIG. 10 that is described later, it is also possible that the bias current adjuster 43 is configured with multiple thermistors SM 51 and one fixed resistor Rb 52.

The thermistor SM 51 is generally an electronic component that is utilized for temperature detection, and the resistance value thereof changes in response to temperature changes. For example, in a case where the temperature of the thermistor rises, the resistance value of the thermistor will decrease. Contrarily, in a case where the temperature of the thermistor drops, the resistance value of the thermistor will increase. In this way, since the resistance value of the thermistor changes as the temperature of the thermistor changes, the magnitude of the bias control signal, which is input to the terminal of the bias current adjuster 43 to which the thermistor SM 51 is connected, also changes. That is, the magnitude (current value) of the bias current is adjusted, based on the magnitude of the bias control signal that is input to the bias current adjuster 43.

Additionally, the responsiveness of the light source, which is related to the time by which light with a stable intensity can be emitted, changes with temperature changes of the light source, and, therefore, it is preferable if temperature changes of the light source approximately correspond to temperature changes of the thermistor, in order to maintain preferable responsiveness of the light source. Thus, it is preferable if the position where the thermistor is placed is as close as possible to the position where the light source is placed. Alternatively, as will be described later, the thermistor may also be placed in the vicinity of the light source driver 42.

Furthermore, thermistors SM with any characteristics in terms of change in the temperature and the resistance value cannot be used as the thermistor SM, and it is necessary to select a thermistor SM with characteristics in terms of change, in consideration of responsiveness of the light source. Considering the total resistance value of the bias current adjuster 43, which includes the fixed resistor Rb, and an oscillation delay time td, it is necessary to select a thermistor SM with such a characteristic that the resistance value changes in a predetermined range according to a predetermined temperature change, or it is necessary to manufacture a thermistor SM with such a characteristic.

For example, as will be described later, in order to increase the bias current Ib so that the bias current Ib becomes closer to a predetermined threshold current Ith as the temperature of the light source rises, as the thermistor, a thermistor with such a characteristic that the resistance value decreases by a predetermined resistance change amount according to the temperature rise is selected.

Furthermore, the change amount $\Delta R$ of the total resistance value of the bias current adjuster, which corresponds to the current change amount of the bias current that increases while the temperature of the light source changes from the first temperature T1 to the second temperature T2 (T2>T1), is calculated, in order to select a thermistor whose resistance value changes by the change amount $\Delta R$ while the temperature of the thermistor changes from the first temperature to the second temperature. Specifically, a thermistor whose resistance value decreases by the change amount $\Delta R$ while the temperature of the thermistor rises from the first temperature to the second temperature is selected.

Explanations of Drive Current, Bias Current, and Oscillation Delay Time

Figure 4:
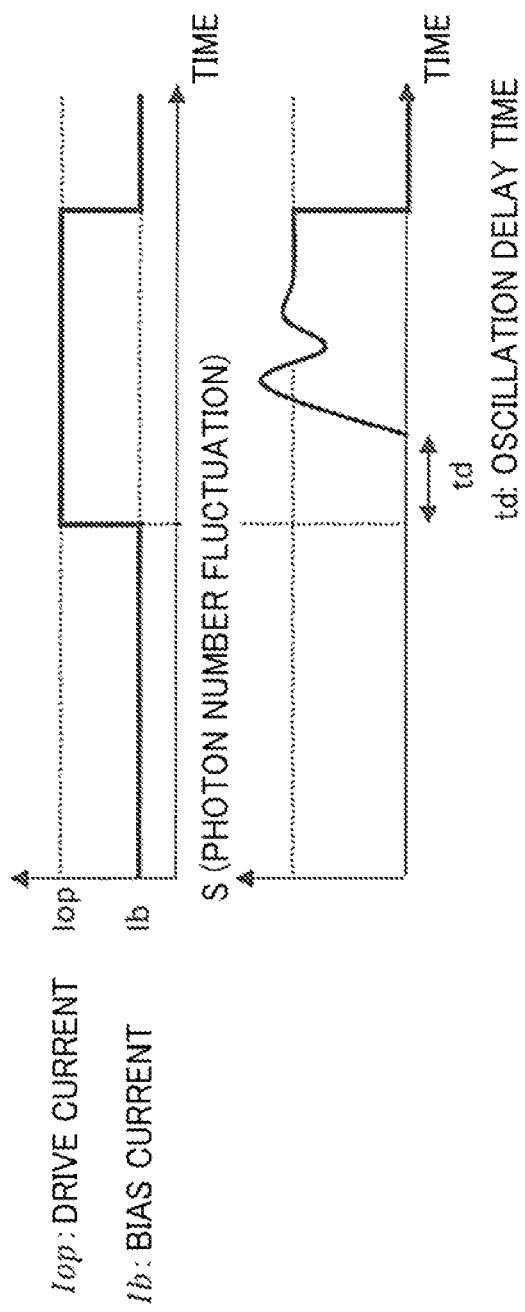
FIG. 4 is an explanatory diagram of the relationship between the drive current and bias current, and the oscillation delay time.

In FIG. 4, an explanatory diagram of the relationship between the drive current and bias current, and the oscillation delay time is illustrated. The drive current Iop is a current provided to the light source to cause the light source (laser diode) to emit light. Further, the minimum value of the current required to cause the light source (laser diode) to emit light is referred to as the threshold current Ith, and the drive current Iop is a current greater than the threshold current Ith. The oscillation delay time td is a time by which stable light emission is achieved after a drive current is applied to the light source and is also referred to as a rise delay time. The shorter the oscillation delay time td is, the better the responsiveness of the light source is. Additionally, the oscillation delay time td changes with the temperature of the light source.

The bias current Ib is a current with a constant current value that is applied to the light source all the time, that is, not only when the light source is being driven but also when the light source is not being driven, in order to shorten the oscillation delay time td. Laser light is not emitted from the light source in a state where only the bias current Ib is applied. Generally speaking, if the bias current Ib is a current that has a fixed constant value, in a case where the temperature of the light source is comparatively low, the oscillation delay time td is relatively short, and, in a case where the temperature of the light source rises, the oscillation delay time td tends to become longer and the responsiveness of the light source tends to deteriorate.

The upper graph of FIG. 4 shows the drive current Iop and the bias current Ib, and the drive current Iop is greater than the bias current Ib (drive current Iop>bias current Ib). When the light source is not driven, only the bias current Ib is provided to the light source from the light source driver 42. In a case where the light source is made to emit light, the drive current Iop, which is raised as a pulse, is provided to the light source. In a case where the light source is made to stop emitting light, the drive current Iop is made to fall as a pulse, so that only the bias current Ib is provided to the light source.

The lower graph of FIG. 4 shows the temporal change of the photon number fluctuation S, and the horizontal time axis corresponds to the upper graph of FIG. 4. The photon number fluctuation S is proportional to the light output and is information indicative of the fluctuation of the light output. The photon number fluctuation S can be measured, for example, by measuring the laser power.

As illustrated in the upper graph of FIG. 4, in a case where the current provided to the light source changes from the bias current Ib to the drive current Iop as a pulse and has exceeded the threshold current Ith, the photon number fluctuation S rises with a delay of the oscillation delay time td. For example, the oscillation delay time td is about 11.1 nanoseconds although the oscillation delay time td varies depending on the value of the bias current Ib. As illustrated in the lower graph of FIG. 4, after the photon number fluctuation S has risen, the photon number fluctuation S fluctuates in an analog manner, and, after a lapse of about 12 nanoseconds, the photon number fluctuation S becomes a stable value, so that laser light with a constant intensity will be emitted. In order to improve the responsiveness of the light source, it is necessary to shorten the oscillation delay time td, and, as will be described later, according to the calculation formula of the oscillation delay time td, the numerical value of the bias current Ib should be made closer to the numerical value of the threshold current Ith, in order to shorten the oscillation delay time td.

However, the threshold current changes depending on the temperature, and, generally, in a case where the temperature of the light source is low, the threshold current is low, and, as the temperature rises, the threshold current tends to increase. Although the bias control signal described above is information provided to the light source driver 42 from the bias current adjuster 43 in order to adjust the bias current Ib, the bias control signal is changed according to the temperature change of the bias current adjuster 43 in the present invention. That is, the bias current adjuster 43 includes a thermistor, so as to change the bias control signal by use of the fact that the resistance value of the thermistor changes according to the temperature change.

Figures 5A, 5B:
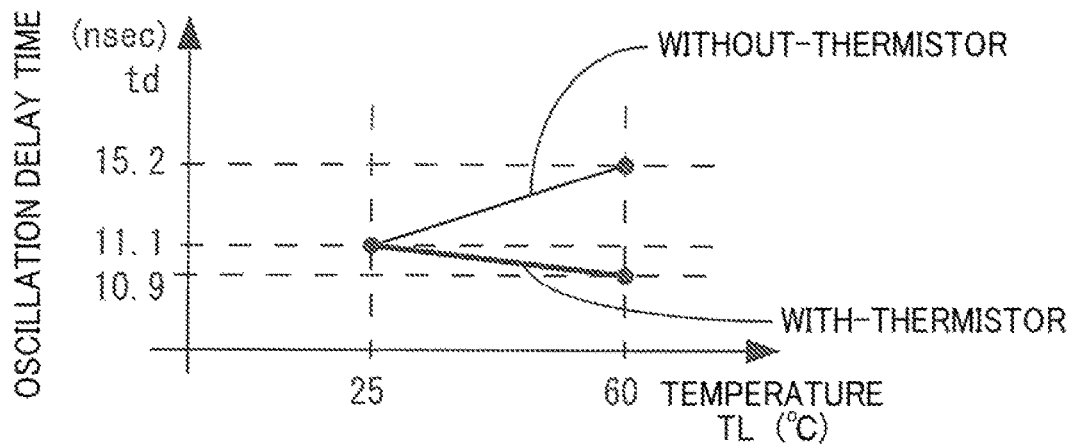
FIG. 5A and FIG. 5B are explanatory diagrams of an embodiment of the relationship between the oscillation delay time and the temperature of the light source and an embodiment of change in the oscillation delay time.

In FIGS. 5A and 5B, explanatory diagrams of an embodiment of the relationship between the oscillation delay time and the temperature of the light source and an embodiment of change in the oscillation delay time are illustrated. FIG. 5A is an embodiment of a graph showing the relationship between the oscillation delay time td and the temperature TL of the light source. FIG. 5B is an embodiment of numerical values showing the relationship between the oscillation delay time td and the temperature TL of the light source and the change amounts of the oscillation delay time td.

In the graph of FIG. 5A, the temperature range in which the optical scanning device is actually operated is set from 25° C. to 60° C., and the oscillation delay time td that changes within this temperature range is illustrated. Here, the oscillation delay times td in a case where the thermistor SM 51 is included in the bias current adjuster 43 as illustrated in FIG. 3 (with-thermistor) and in a case where the thermistor SM 51 is not included (without-thermistor) are illustrated. In a case where the thermistor SM 51 is not included, the bias current adjuster 43 is configured only with the fixed resistor Rb 52 without the thermistor SM 51 of FIG. 3, and therefore this case corresponds to a case where the bias current Ib has a fixed constant current value.

In FIG. 5A and FIG. 5B, for example, in the case of without-thermistor, if the temperature TL is 25° C., the oscillation delay time (td1) is 11.1 nsec, but, if the temperature TL is 60° C., the oscillation delay time (td2) is 15.2 nsec. That is, as illustrated in FIG. 5B, the change amount of the oscillation delay time (td2−td1) is 4.1 nsec, and therefore, if the temperature TL of the light source rises, the oscillation delay time td becomes longer (delay amount: large), which means that the responsiveness of the light source has deteriorated.

On the other hand, in the case of with-thermistor, if the temperature TL is 25° C., the oscillation delay time (td1) is 11.1 nsec, but, if the temperature TL is 60° C., the oscillation delay time (td2) is 10.9 nsec. That is, as illustrated in FIG. 5B, the change amount of the oscillation delay time (td2−td1) is −0.2 nsec, and therefore, if the temperature TL of the light source rises, the oscillation delay time td becomes shorter (delay amount: small), which means that the responsiveness of the light source has improved.

In this way, by configuring the bias current adjuster 43 with the fixed resistor Rb and the thermistor SM as illustrated in FIG. 3, it is possible to shorten the oscillation delay time td even in a case where the temperature TL of the light source rises, so as to improve the responsiveness of the light source. Moreover, although depending on the characteristics, thermistors SM currently on the market are generally sold at low prices. Therefore, even though one thermistor SM is added, the price of the optical scanning device will not significantly increase, and thus it is possible to provide an optical scanning device with improved light source responsiveness at a low price.

Figure 6A:
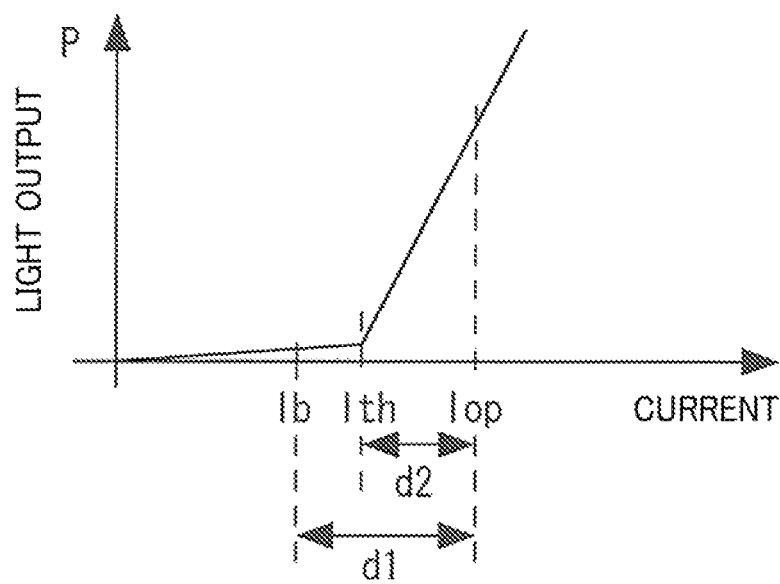

In FIG. 6A and FIG. 6B, explanatory diagrams of an embodiment of the relationship between light output and current and an embodiment of the calculation formula of the oscillation delay time are illustrated. Here, a schematic graph of an embodiment showing the relationship between the light output P of the light source and three currents as well as the calculation formula of the oscillation delay time are illustrated. In FIG. 6A, the graph of bias current Ib, threshold current Ith, drive current Iop, and light output P are illustrated. The light output P corresponds to the intensity (luminance) of the light emitted from the light source.

In FIG. 6A, the bias current Ib is smaller than the threshold current Ith (Ib<Ith), and the drive current Iop is greater than the threshold current Ith (Iop>Ith). As described above, laser light is emitted from the light source if a current that is greater than the threshold current Ith is provided to the light source, but the laser light is not emitted even if a current that is smaller than the threshold current Ith is provided to the light source. Furthermore, if the temperature of the light source is constant, both the bias current Ib and the threshold current Ith are constant values. The drive current Iop has a different value if the intensity of the light emitted from the light source is different, but, for example, if the intensity of the light to irradiate the photosensitive drum is uniquely determined, the numerical value of the drive current Iop is also set to a fixed value.

In FIG. 6A, the difference between the bias current Ib and the drive current Iop is assumed to be d1 (=Iop−Ib), and the difference between the threshold current Ith and the drive current Iop is assumed to be d2 (=Iop−Ith). Because of Ib<Ith, the differences between these current values are d1>d2. As described above, in order to shorten the oscillation delay time td and improve the responsiveness of the light source, it is necessary to bring the bias current Ib closer to the threshold current Ith. In other words, in order to shorten the oscillation delay time td, it is necessary to bring the current value difference d1 on the right side of the calculation formula of the oscillation delay time td illustrated in FIG. 6B closer to the current value difference d2.

FIG. 6B is a theoretical formula for calculating the oscillation delay time td from a light emission characteristic value of the laser diode, which is the light source. In the calculation formula of FIG. 6B, the oscillation delay time td is calculated by multiplying the carrier life τs by loge(Iop−Ib/Iop−Ith). The carrier life τs is the degree of spontaneous emission of electrons, which are carriers, and the carrier life τs can be obtained based on the actual measurement value of the oscillation delay time td when the bias current Ib is zero. This theoretical formula is derived from a conventionally-known rate equation for semiconductor lasers. For example, this theoretical formula can be derived by modeling the relationship where electrons, which are carriers, recombine with holes to generate photons.

In FIG. 7A and FIG. 7B, explanatory diagrams comparing measured values of the bias current and calculated values of the oscillation delay time corresponding to temperature changes in a case where a thermistor is not included and in a case where a thermistor is included are illustrated. Unlike the present application, the numerical values in the table of FIG. 7A show the case where the bias current adjuster 43 does not include a thermistor and is configured with a fixed resistor only, so that the bias current is adjusted only by the fixed resistor. The numerical values in the table of FIG. 7B correspond to the bias current adjuster 43 of the present application, and the numerical values show the case where the bias current adjuster 43 includes a fixed resistor and a thermistor that are connected in series, so that the bias current is adjusted by the fixed resistor and the thermistor.

Here, as a precondition for calculation, the bias current value, the threshold current value, etc., are set as described below. The carrier life τs is set to a constant value of 19.5. P_Ave@110(dec) is set to a constant value of 5.0 [mW]. P_Ave@110(dec) is data indicative of the light output of the laser when a digital value of 110(dec) is commanded. The average value Ith_Ave of the threshold current is set to a constant value of 13.4 [mA]. Iop_Ave@15 mW is set to a constant value of 38.4 [mA]. Iop_Ave@15 mW is data indicative of the average value of the drive current in a case where the temperature is 25° C. and the light output of the laser is 15 mW.

The average value Ib_Ave of the bias current at 25° C. is set to a constant value of 7.0 [mA]. In a case where the bias current adjuster 43 is configured only with a fixed resistor and without a thermistor, the average value Ib_Ave of the bias current remains the constant value (7.0 [mA]) even when the temperature reaches 60° C. in (A-2) of FIG. 7A as described below. Additionally, it is assumed that the drive current Iop and bias current Ib are measured with the temperature of the light source being at the lower limit (25° C.) and the upper limit (60° C.) of the temperature where the light source is actually used.

First, the average value Iop_Ave of the drive current in a case of FIG. 7A where the bias current is adjusted only by a fixed resistor and the temperature does not change from 25° C. as in (A-1) of FIG. 7A is measured, and then the above-described carrier life τs, average value of the bias current Ib, and average value of the threshold current Ith are assigned to the calculation formula of FIG. 6B, so as to calculate the oscillation delay time td. Here, if the measured value of Iop_Ave is 21.8 [mA], the average value td_Ave of the oscillation delay time is 11.1 [ns] from the calculation formula of FIG. 6B.

Next, the average value Iop_Ave_up of the drive current in a case where the temperature changes to 60° C. as in (A-2) of FIG. 7A is measured, so as to calculate the oscillation delay time td by use of the calculation formula of FIG. 6B as well. If the average value Iop_Ave_up of the drive current at the temperature of 60° C. in (A-2) is 27.0 [mA], the average value td_Ave_up of the oscillation delay time is 15.2 [ns] from the calculation formula of FIG. 6B. Here, the difference (td difference) between the oscillation delay times td in a case of FIG. 7A where the bias current is adjusted only by a fixed resistor and the temperature changes from 25° C. to 60° C. is 4.1 [ns] from 15.2−11.1. That is, the oscillation delay time td increases by 4.1 [ns] due to the temperature change from 25° C. to 60° C., which means that the responsiveness of the light source deteriorates.

The average value Iop_Ave of the drive current in a case of FIG. 7B where the bias current is adjusted by a fixed resistor and a thermistor and the temperature does not change from 25° C. as in (B-1) of FIG. 7B is measured. Note that, in order to compare the oscillation delay time td after temperature change with FIG. 7A, the fixed resistor and thermistor are properly selected, so that the average value Iop_Ave of the drive current in the case where the temperature does not change from 25° C. is 21.8 [mA]. In the case of (B-1) of FIG. 7B, if the above-described carrier life τs, average value of the bias current Ib, average value of the threshold current Ith are assigned to the calculation formula of FIG. 6B so as to calculate the oscillation delay time td, the average value td_Ave of the oscillation delay time td is 11.1 [ns], as in (A-1) of FIG. 7A.

Next, the average value Iop_Ave_up of the drive current in a case where the temperature changes to 60° C. as in (B-2) of FIG. 7B is measured, so as to calculate the oscillation delay time td by use of the calculation formula of FIG. 6B as well. In this case, because of the thermistor SM, in a case where the temperature rises to 60° C., the resistance value of the thermistor SM decreases, and, accordingly, the numerical value of the bias current Ib increases. That is, although the measured value of the average value Iop_Ave_up of the drive current in the case where the temperature changes from 25° C. to 60° C. in (B-2) of FIG. 7B is 27.0 [mA], the average value Ib_Ave of the bias current at 60° C. is, for example, 10.95 [mA], which has increased from (B-1) of FIG. 7B.

Therefore, if the average value Ib_Ave of the bias current at 60° C. and the above-described carrier life τs and average value of the threshold current Ith are assigned to the calculation formula of FIG. 6B so as to calculate the oscillation delay time td, the average value td_Ave_up of the oscillation delay time td in (B-2) of FIG. 7B is 10.9 [ns].

Here, the difference (td difference) between the oscillation delay times td in the case of FIG. 7B where the bias current is adjusted by a fixed resistor and a thermistor and the temperature changes from 25° C. to 60° C. is −0.2 [ns] from 10.9−11.1. That is, by adopting a properly selected fixed resistor and thermistor for the bias current adjuster 43, the oscillation delay time td is reduced by 0.2 [ns] due to the temperature change from 25° C. to 60° C., so that the responsiveness of the light source can be improved.

Embodiment of Method for Selecting Thermistor and Fixed Resistor

Figure 8:
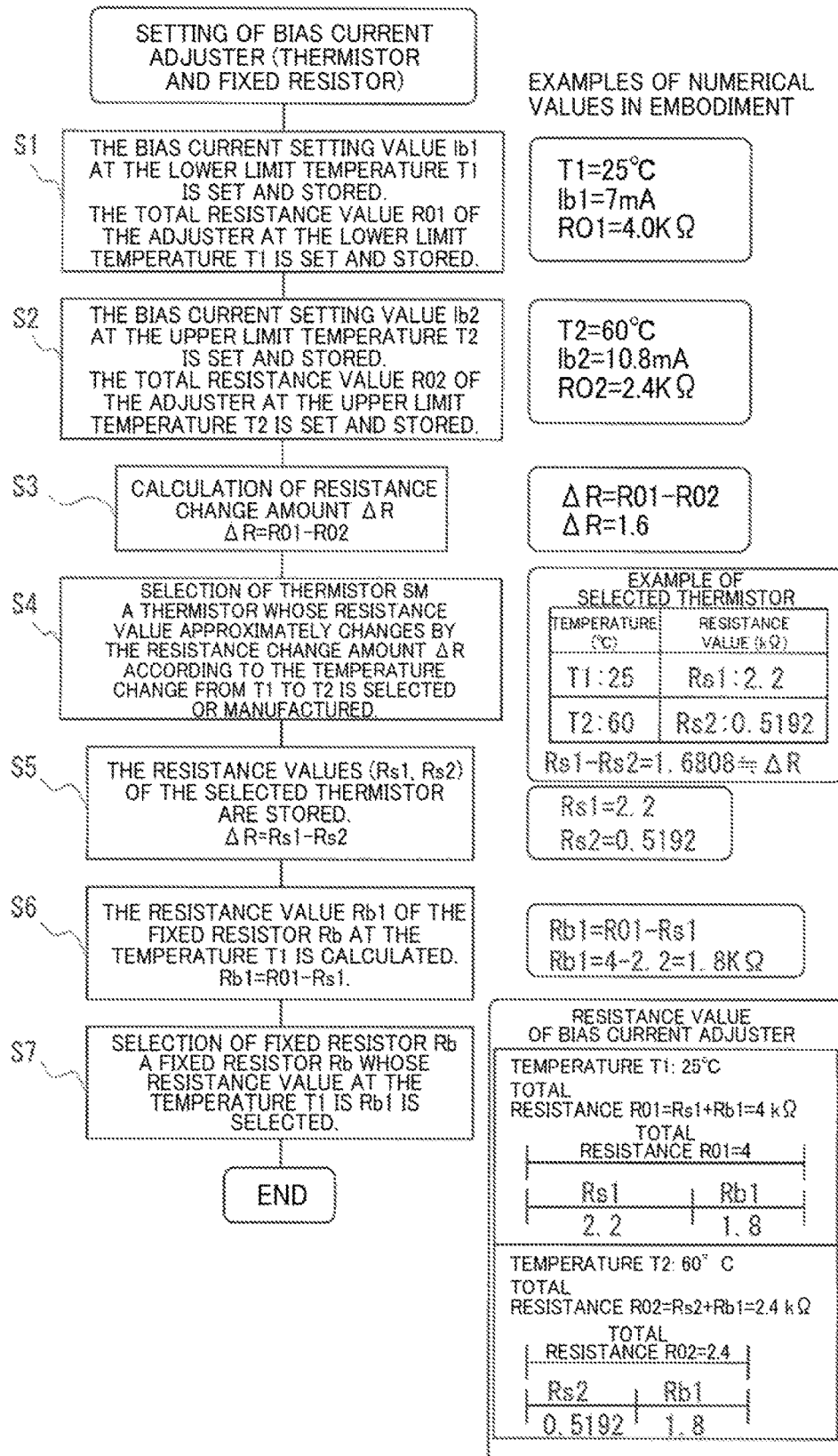
FIG. 8 is a flowchart illustrating an embodiment of the method for selecting the thermistor and the fixed resistor, which configure the bias current adjuster of the optical scanning device of the present invention.

FIG. 8 is a flowchart illustrating an embodiment of the method for selecting the thermistor and the fixed resistor, which configure the bias current adjuster of the optical scanning device of the present invention. In the herein-described embodiment, a thermistor whose resistance value changes according to a predetermined temperature change and a fixed resistor with a resistance value corresponding to the total resistance value of the bias current adjuster 43, which includes the selected thermistor, are selected. Further, as illustrated in FIG. 3, it is assumed that the bias current adjuster 43 includes one thermistor SM and one fixed resistor Rb connected in series. The thermistor and fixed resistor are selected by a person in charge of designing the optical scanning device, for example.

In a case of normal use of the optical scanning device, the temperature range when emitting light from the light source is set in advance, and the temperature of the lower limit (lower limit temperature) of the temperature range is set as T1, and the temperature of the upper limit (upper limit temperature) of the temperature range is set as T2. Further, in the present embodiment, the lower limit temperature T1 when emitting light from the light source is set to 25° C., and the upper limit temperature T2 is set to 60° C. However, since the lower limit temperature T1 and the upper limit temperature T2 are determined by the light output of the optical scanning device, the surrounding temperature of the optical scanning device, the temperature of the scanning controller, etc., the lower limit temperature T1 and the upper limit temperature T2 are not limited to the above-described values. On the right side of each step in FIG. 8, an example of numerical values to be set or calculated in that step is illustrated.

In Step S1 of FIG. 8, the setting value Ib1 of the bias current at the lower limit temperature T1 is set and stored. For example, this bias current setting value Ib1 can be set by adjusting the PIDC curve of the photoconductor. In the present embodiment, the bias current setting value Ib1 at 25° C., which is the lower limit temperature T1, is 7 mA. Further, the total resistance value R01 of the bias current adjuster 43 at the lower limit temperature T1 is set and stored. For example, this total resistance value R01 can be set from a relation formula (Ib1=Vb/R01×gain) of the bias current setting value Ib1, the reference voltage Vb, and the total resistance value R01. Here, the reference voltage Vb is indicative of an internal reference voltage of the light source driver (laser driver) 42, and the gain is a current gain. In the present example, the total resistance value R01 at 25° C., which is the lower limit temperature T1, is 4.0 kΩ.

In Step S2, the bias current setting value Ib2 at the upper limit temperature T2 is set and stored. For example, based on such a calculation formula for an oscillation delay time of a laser diode as described above and temperature characteristic data of the light source (laser diode), such a bias current setting value with which the oscillation delay time td does not change is extracted, so that the extracted value is set and stored as the bias current setting value Ib2. In the present embodiment, in a case where the bias current setting value Ib1 at 25° C., which is the lower limit temperature T1, is 7 mA, it is possible to set the bias current setting value Ib2 at 60° C., which is the upper limit temperature T2, to 10.8 mA by extracting such a bias current setting value with which the oscillation delay time td is the same value as that in a case of the lower limit temperature T1.

Furthermore, in Step S2, the total resistance value R02 of the bias current adjuster 43 at the upper limit temperature T2 is set and stored. For example, as with the above-described total resistance value R01, this total resistance value R02 can be set from a relation formula (Ib2=Vb/R02×gain) of the bias current setting value Ib2, the reference voltage Vb, and the total resistance value R02. In the present example, the total resistance value R02 at 60° C., which is the upper limit temperature T2, can be set to 2.4 kΩ.

In Step S3, the change amount of the resistance values (resistance change amount ΔR) is calculated from the total resistance values (R01, R02) of the lower limit temperature T1 and the upper limit temperature T2. That is, the resistance change amount ΔR is calculated from ΔR=R01−R02. In the case of the above-described total resistance values, the resistance change amount ΔR is ΔR=R01−R02=4.0−2.4=1.6 kΩ.

In Step S4, a thermistor SM of the bias current adjuster 43 is selected. Here, such a thermistor SM whose resistance value changes (decreases) by approximately the resistance change amount ΔR according to the temperature change from the lower limit temperature T1 to the upper limit temperature T2 is selected. Alternatively, in a case where such a thermistor SM whose resistance value changes by approximately the resistance change amount ΔR does not exist in commercial products, it is also possible to manufacture a thermistor SM whose resistance value changes by approximately the resistance change amount ΔR. An example of the selected thermistor is indicated on the right side of Step S4 in FIG. 8. For example, a thermistor SM whose resistance value Rs1 at 25° C., which is the lower limit temperature T1, is 2.2 kΩ and whose resistance value Rs2 at 60° C., which is the upper limit temperature T2, decreases to 0.5192 kΩ. In this case, Rs1−Rs2 is 1.6808 kΩ, which is almost equal to the above-described resistance change amount ΔR (=1.6 kΩ).

In Step S5, the resistance value Rs1 at the lower limit temperature T1 and the resistance value Rs2 at the upper limit temperature T2 of the selected thermistor SM are stored. For example, the resistance value Rs1=2.2 kΩ and the resistance value Rs2=0.5192 kΩ are stored. In Step S6, by use of the total resistance value R01 at the lower limit temperature T1 and the resistance value Rs1 of the thermistor, the resistance value Rb1 of the fixed resistor Rb at the lower limit temperature T1 is calculated. In a case where the thermistor SM and fixed resistor Rb are connected in series, the resistance value Rb1 is calculated by Rb1=R01−Rs1. As described above, in a case where the total resistance value R01 at 25° C., which is the lower limit temperature T1, is 4.0 kΩ and the resistance value Rs1 of the thermistor at 25° C. is 2.2 kΩ, the resistance value Rb1 of the fixed resistor Rb is Rb1=R01−Rs1=4.0−2.2=1.8 kΩ.

In Step S7, a fixed resistor Rb of the bias current adjuster 43 is selected. As the fixed resistor Rb, a fixed resistor Rb whose resistance value at the lower limit temperature T1 is Rb1, which is calculated as described above, is selected. For example, such a fixed resistor Rb whose resistance value at 25° C., which is the lower limit temperature T1, is Rb1 (=1.8 kΩ), which is obtained by the above-described calculation, is selected. Alternatively, a fixed resistor Rb having such a resistance value may be manufactured.

In a case where such a thermistor SM and fixed resistor Rb as in the above-described embodiment are selected, the resistance value of the bias current adjuster 43 changes as follows according to temperature change. Regarding the resistance value at 25° C., which is the lower limit temperature T1, the resistance value Rs1 of the thermistor SM is 2.2 kΩ and the resistance value Rb1 of the fixed resistor Rb is 1.8 kΩ, so that the integrated resistance value thereof, i.e., the total resistance value R01 of the bias current adjuster 43 is 4.0 kΩ. On the other hand, regarding the resistance value at 60° C., which is the upper limit temperature T2, the resistance value Rs2 of the thermistor SM is 0.5192 kΩ and the resistance value Rb1 of the fixed resistor Rb is 1.8 kΩ, so that the integrated resistance value thereof, i.e., the total resistance value R02 of the bias current adjuster 43 is approximately 2.4 kΩ. In this way, it is possible to adjust the current value of the bias current, by taking advantage of changes in the total resistance value of the bias current adjuster 43 according to the temperature change.

If such a thermistor SM and fixed resistor Rb selected as described above are mounted on the bias current adjuster 43, it is possible to make the oscillation delay time td barely fluctuate even if the temperature of the light source changes, and, furthermore, compared to a case in which the bias current adjuster 43 is configured only with a fixed resistor Rb, it is possible to improve the oscillation delay time td, i.e., to improve the responsiveness of the light source.

Embodiment 1 of Bias Current Adjuster of Present Invention Thermistor Placement Example 1

The thermistor 51 is included in the bias current adjuster 43, that is, the thermistor 51 is mounted on a circuit board which is incorporated in the optical scanning device together with the light source 41, the light source driver 42, etc., that configure the optical scanning device. Here, in order to make the oscillation delay time td not fluctuate by use of the characteristics of the thermistor 51 in terms of temperature change, it is preferable if temperature changes of the thermistor 51 approximately correspond to temperature changes of the light source. Therefore, it is preferable if the position where the thermistor 51 is placed is close to the light source 41. For example, it is preferable if a DIP type thermistor 51 is placed in such a positional relationship that the thermistor 51 and the light source 41 are close to each other.

Embodiment 2 of Bias Current Adjuster of Present Invention Thermistor Placement Example 2

Figure 9:
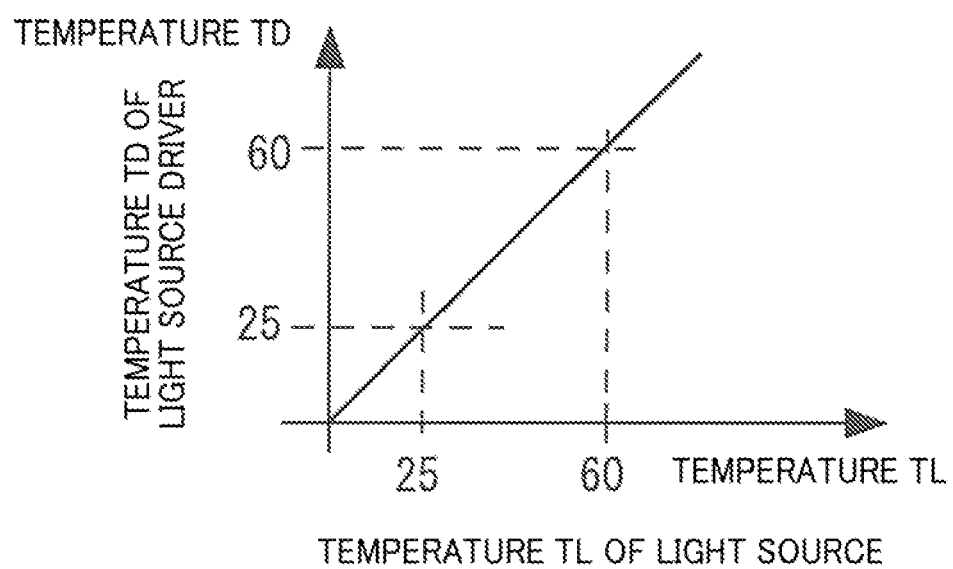
FIG. 9 is a graph of an embodiment indicating the relationship between the temperatures of the light source driver and the light source of the present invention.

Furthermore, the position where the thermistor 51 is placed may be close to the light source driver 42. In FIG. 9, a graph of an embodiment indicating the relationship between the temperatures of the light source driver and the light source of the present invention is illustrated. Since the light source driver (laser driver) 42 is to apply a drive current to the light source 41, the light source driver 42 is placed near the light source 41. When the temperature changes of the light source 41 and the light source driver 42 are measured, the temperature TL of the light source 41 and the temperature TD of the light source driver 42 are in a proportional relationship and, for example, change so as to have almost the same numerical values as illustrated in FIG. 9.

Alternatively, although depending on the circuit configuration of the light source driver 42 and the placement of the light source 41, the difference between the temperature TL of the light source 41 and the temperature TD of the light source driver 42 is usually equal to or lower than 10° C. Further, if the difference of the temperature of the thermistor 51 and the temperature of the light source 41 can be equal to or lower than 10° C., there is little possibility of affecting the fluctuation of the oscillation delay time td since there is little characteristic difference of the light source 41. Therefore, in a case where it is difficult to place the thermistor 51 near the light source 41, the oscillation delay time td will not significantly deteriorate even in a case where the thermistor 51 is placed near the light source driver 42. For example, in a case where the light source driver 42 is configured with one LSI for a laser driver, and the LSI for a laser driver and the bias current adjuster 43 are mounted on the same circuit board, the LSI for a laser driver and the thermistor 51 may be placed as close as possible to each other on the circuit board.

Embodiment 3 of Bias Current Adjuster of Present Invention Thermistor Connection Example 1

As illustrated in FIG. 3, the bias current adjuster 43 may include at least one thermistor 51. Furthermore, one thermistor SM and one fixed resistor Rb are connected in series. In this case, the thermistor SM and fixed resistor Rb with such resistance values as described above with reference to FIG. 8 may be selected, for example.

Embodiment 4 of Bias Current Adjuster of Present Invention Thermistor Connection Example 2

The number of thermistor 51 which configures the bias current adjuster 43 does not have to be one. Multiple thermistors 51 may be included and the multiple thermistors as a whole have such a resistance value that changes according to temperature change as illustrated in FIG. 8, for example.

In FIG. 10, a block diagram of an embodiment of a configuration related to driving of a light source of the optical scanning device of the present invention is illustrated. In FIG. 10, unlike FIG. 3, three thermistors SM are connected in parallel, and these thermistors SM and one fixed resistor Rb are connected in series. The number of thermistors SM is not limited to three as long as there are two or more thermistors SM. Furthermore, instead of simply connecting multiple thermistors 51 in parallel, it is also possible that multiple thermistors 51 are connected in series and parallel in combination. Note that the number of fixed resistors Rb is also not limited to one, and it is also possible that two or more fixed resistors Rb are connected in series and parallel in combination.

What is claimed is:
1. An optical scanning device comprising:
a light source;
a light source driver that provides the light source with a drive current, on which a bias current that fluctuates according to temperature change is superimposed, for emitting light from the light source; and
a bias current adjuster that provides the light source driver with a bias control signal for adjusting a magnitude of the bias current,
wherein the bias current adjuster includes a thermistor for changing a magnitude of the bias control signal according to the temperature change,
wherein the bias control signal that has automatically changed according to the temperature change of the thermistor is provided to the light source driver, so that the light source driver changes the magnitude of the bias current to be superimposed fluctuate, based on the provided bias control signal,
wherein the thermistor is connected to the light source driver,
wherein, in order to increase the bias current so that the bias current becomes closer to a predetermined threshold current as a temperature of the light source rises, as the thermistor, a thermistor having a characteristic that a resistance value of the thermistor decreases by a predetermined resistance change amount according to the temperature rise is selected,
wherein, by utilizing a change of the resistance value of the thermistor caused by a temperature change of the thermistor, a current flowing between the thermistor and the light source driver is changed so that the bias current adjuster changes the magnitude of the bias control signal,
wherein the bias current adjuster further includes a fixed resistor that is connected to the thermistor in series,
wherein the thermistor is selected to have a resistance value that is changed by a resistance change amount ΔR of total resistance value of the bias current adjuster according to a temperature change from a lower limit temperature T1 to an upper limit temperature T2, such that:
the lower limit temperature T1 and an upper limit temperature T2 for emitting light from the light source are set;
a total resistance value R01 of the bias current adjuster and a setting value Ib1 of the bias current at the lower limit temperature T1 are set;
a total resistance value R02 of the bias current adjuster and a setting value Ib2 of the bias current at the upper limit temperature T2 are set; and
the resistance change amount ΔR is calculated from R01−R02; and
wherein the fixed resistor is selected to have a resistance value Rb1 at the lower limit temperature T1, such that:
a first resistance value Rs1 at the lower limit temperature T1 and a second resistance value Rs2 at the upper limit temperature T2 of the selected thermistor are stored; and
the resistance value Rb1 at the lower limit temperature T1 is calculated from R01-Rs1.
2. The optical scanning device according to claim 1, wherein the bias current adjuster includes a plurality of thermistors and one fixed resistor.
3. The optical scanning device according to claim 1, wherein the thermistor is placed in a vicinity of the light source or the light source driver.

4. An image forming apparatus comprising the optical scanning device according to claim 1.

5. A method for selecting a component of a bias current adjuster of an optical scanning device which includes a light source, a light source driver that provides the light source with a drive current, on which a bias current that fluctuates according to temperature change is superimposed, for emitting light from the light source, and the bias current adjuster that provides the light source driver with a bias control signal for adjusting a magnitude of the bias current, wherein the bias current adjuster includes one thermistor and one fixed resistor that are connected in series, the method comprising:

setting a lower limit temperature T1 and an upper limit temperature T2 for emitting light from the light source;

setting a total resistance value R01 of the bias current adjuster and a setting value Ib1 of the bias current at the lower limit temperature T1;

setting a total resistance value R02 of the bias current adjuster and a setting value Ib2 of the bias current at the upper limit temperature T2;

calculating a resistance change amount ΔR of total resistance value of the bias current adjuster from R01−R02;

selecting, as a thermistor of the bias current adjuster, a thermistor whose resistance value changes by the resistance change amount ΔR according to the temperature change from the lower limit temperature T1 to the upper limit temperature T2;

storing a first resistance value Rs1 at the lower limit temperature T1 and a second resistance value Rs2 at the upper limit temperature T2 of the selected thermistor;

calculating a resistance value Rb1 of a fixed resistor at the lower limit temperature T1 from R01−Rs1; and selecting, as a fixed resistor of the bias current adjuster, a fixed resistor whose resistance value at the lower limit temperature T1 is the calculated resistance value Rb1.

* * * * *